United States Patent [19]

Kinoshita et al.

[11] Patent Number: 4,631,593
[45] Date of Patent: Dec. 23, 1986

[54] STILL PICTURE RECORDING APPARATUS AND A SOLID-STATE IMAGE PICKUP DEVICE SUITABLE FOR THIS APPARATUS

[75] Inventors: Takao Kinoshita, Tokyo; Shinji Sakai, Yokohama, both of Japan

[73] Assignee: Canon Kabushiki Kaisha, Tokyo, Japan

[21] Appl. No.: 841,025

[22] Filed: Mar. 17, 1986

Related U.S. Application Data

[63] Continuation of Ser. No. 557,937, Dec. 5, 1983, abandoned.

[30] Foreign Application Priority Data

Dec. 14, 1982 [JP]  Japan ................. 57-218882
Dec. 14, 1982 [JP]  Japan ................. 57-218883

[51] Int. Cl.$^4$ ............................ H04N 3/14
[52] U.S. Cl. ..................... 358/213; 358/909
[58] Field of Search ........... 358/212, 213, 909, 167; 357/24 LR, 24 M

[56] References Cited

U.S. PATENT DOCUMENTS 4,245,164  1/1981  Funahashi .................... 357/24 LR
4,328,432  5/1982  Yamazaki ..................... 357/24 LR
4,366,501  12/1982  Tsunekawa et al. ............. 358/909
4,415,937  11/1983  Nishizawa et al. ............. 358/213

Primary Examiner—Gene Z. Rubinson
Assistant Examiner—Stephen Brinich
Attorney, Agent, or Firm—Fitzpatrick, Cella, Harper & Scinto

[57] ABSTRACT

A still picture recording apparatus comprising: a solid-state image pick-up device having an image pick-up part or image sensing part for generating charges in response to an incident light, a memory part for taking the charges generated by the image pick-up part and for temporarily storing them, and a readout part for reading out the stored charges from the memory part; a recorder for recording a video signal to be output from the image pickup device; and a controller for controlling the recorder and the image pick-up part, this controller enabling the recorder to record a still picture and causing the image pick-up part to prevent overflow charges which are generated by the image pick-up part from flowing into the memory part in the image pick-up device during the recording of the image pick-up signal by the recorder.

23 Claims, 11 Drawing Figures

STILL PICTURE RECORDING APPARATUS AND A SOLID-STATE IMAGE PICKUP DEVICE SUITABLE FOR THIS APPARATUS

This application is a continuation of application Ser. No. 557,937 filed Dec. 5, 1983, now abandoned.

BACKGROUND OF THE INVENTION

1. Field of the Invention

The present invention relates to a still picture recording apparatus and, more particularly, to a still picture recording apparatus to record a still picture using a solid-state image pickup device such as a CCD, BBD, etc. as image pickup means, and to a solid-state image pickup device which is suitable for this apparatus.

2. Description of the Prior Art

Many still picture recording apparatuses using solid-state image pickup devices have already been proposed.

As an image pickup device applicable to such an apparatus, various such devices including a frame transfer type CCD, an interline type CCD, etc. are known. However, in the case of the frame transfer type CCD, for example, in order to prevent blooming in association with generation of excess charges of a image pickup part or image sensing part in the CCD of this type, it is generally necessary to take countermeasures against the blooming by providing overflow drains between each two columns of an array of radiation sensitive cells arranged in rows and columns constituting the image sensing part, or at least after every n columns, or by other methods. However, in the case where the blooming preventing portions such as the overflow drains or the like are provided between each two columns of an array of radiation sensitive cells or between columns for every nth column as described above, there is a disadvantage that the horizontal (lateral) dimension of the image sensing part increases corresponding to such blooming preventing portions. Or otherwise, to prevent an increase in horizontal dimension, the horizontal dimension of each radiation sensitive cell has to be inevitably reduced; this contrarily causes the radiation receiving area of each radiation sensitive cell to adversely decrease, so that this method is disadvantageous in terms of the S/N ratio of a signal in particular. Therefore, particularly with respect to a solid-state image pickup device of the frame transfer type, it is actually impossible to improve the resolution in the horizontal direction as desired since the number of radiation sensitive cells in the horizontal direction cannot be greatly increased.

On the contrary, if the blooming preventing portions are curtailed or are completely eliminated from the image sensing part the excess charges generated in the image sensing part will flow into the memory part, so that there is a large risk the signal charges which have been formerly temporarily stored in the memory part for readout being disturbed due to such excess charges.

Therefore, for example in the case where such an image pickup device is used for a still picture recording apparatus such as a still video camera, if such excess charges flow from the image sensing part to the memory part as described above during the recording while reading out the stored charges from the memory part, the recording picture image will be largely disturbed, resulting in an unacceptable defect.

SUMMARY OF THE INVENTION

The present invention was made in consideration of such circumstances as described above and a main object of the invention is to provide a still picture recording apparatus which can completely eliminate the inconveniences in such a conventional apparatus as mentioned above and to provide a solid-state image pickup device which is suitable for this apparatus.

Another object of the present invention is to provide a novel still picture recording apparatus which can eliminate the likelihood of large disturbance of a recording picture image due to the disturbance of a recording picture image due to the disturbance of stored charges in a memory part due to the flowing of excess charges generated by an image sensing part of a solid-state image pickup device into the memory part during the recording of a still picture using such a device, thereby enabling good recording picture image to be always securely provided even if the excess charges are generated in the image sensing part when using such a solid-state image pickup device.

To accomplish the above objects, according to a preferred embodiment of the present invention, there is provided a still picture recording apparatus comprising: a solid-state image pickup device having an image sensing part for generating charges in response to an incident light, a memory part for taking the charges generated by the image sensing part and for temporarily storing them, and a readout part for reading out the stored charges from the memory part; recording means for recording a video signal to be output from the image pickup device; and control means for controlling the recording means and the image sensing part, this controlling means enabling the recording means to record a still picture and causing the image sensing part to prevent overflow charges which are generated by the image sensing part from flowing into the memory part in the image pickup device during the recording of the video signal by the recording means.

This apparatus enables the blooming preventing means which is provided for the image sensing part of the image pickup device to be curtailed in number or to be completely eliminated, thereby enabling the horizontal resolution to be improved. Or otherwise, even if the function of the blooming preventing means is insufficient or even when excess charges which exceed the performance of the blooming preventing means are generated, the present apparatus enables a good picture image to be always securely recorded.

Still another object of the present invention is to provide a novel solid-state image pickup device and, more particularly, to provide a frame transfer type solid-state image pickup device which allows part of the blooming preventing portions provided for every predetermined number of columns of an array of radiation sensitive cells in the image sensing part to fall into disuse, thereby enabling the horizontal dimension of such an array of radiation sensitive cells to be reduced, or which can remarkably improve the horizontal resolution since the number of radiation sensitive cells in the horizontal direction can be greatly increased, and which can also preferably prevent the situation such that the signal charges that have been formerly stored in the memory part are disturbed due to the flowing of the excess charges generated by the image sensing part into the memory part.

To accomplish this object, according to another preferred embodiment of the present invention, there is proposed a frame transfer type solid-state image pickup device comprising: an image sensing part for generating charges in response to an incident light; a memory part for taking the charges generated by the image sensing part and for temporarily storing them; and an excess charge inflow preventing part, disposed near the boundary between the image sensing part and the memory part, for preventing excess charges generated by the image sensing part from flowing into the memory part from the image sensing part.

This device enables the horizontal resolution to be improved and when this image pickup device is used in a still picture recording apparatus and the like, even if excess charges are generated in the image pickup part, this device enables a good picture image to be always securely recorded.

Further other objects and features of the present invention will be apparent from the following detailed description of the embodiment taken in conjunction with the accompanying drawings.

BRIEF DESCRIPTION OF THE DRAWINGS

Embodiments of the present invention will be described hereinbelow with reference to the accompanying drawings, in which.

DESCRIPTION OF THE PREFERRED EMBODIMENTS

An embodiment of a still picture recording apparatus according to the present invention will be first described with reference to FIGS. 1 to 7.

Figure 1:
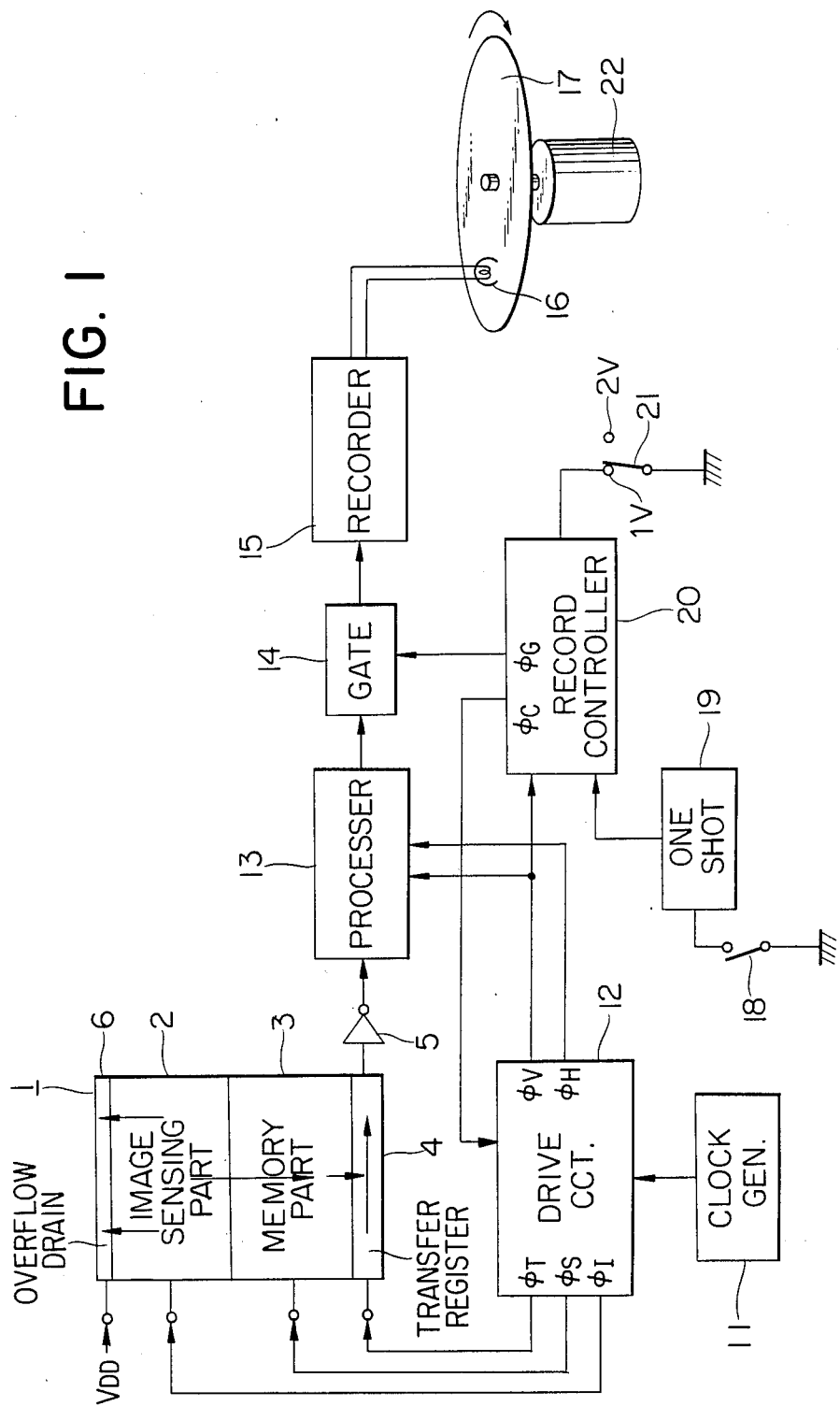
FIG. 1 is a block circuit diagram showing a construction of one embodiment of a still picture recording apparatus according to the present invention in the case where a frame transfer type CCD is used as a solid-state image pickup device.

Referring now to FIG. 1, a reference numeral 1 denotes a frame transfer type CCD as a solid-state image pickup device for the image pickup; 2 indicates an image sensing part having an array of a plurality of radiation sensitive cells (picture elements) arranged in rows and columns for generating charges in response to an incident light, respectively; and 3 represents a memory part similarly having an array of a plurality of charge storage cells arranged in rows and columns for taking the charges and temporarily storing them to read out the charges generated by the image sensing part 2. As will be described later, each column in each array of the radiation sensitive cells and charge storage cells is separated from the next by a channel stopper. A reference numeral 4 denotes a horizontal shift register for fetching the stored charges from the memory part 3 on a line-by-line basis and transferring them horizontally, thereby reading out the charges; 5 indicates an output part or an output amplifier, provided at the final stage of the horizontal register 4, for converting the charge signals to be sequentially transferred from the register 4 into a voltage and outputting it; and 6 represents an overflow drain, disposed to the position adjacent to the uppermost portion of the image sensing part 2, for draining the overflow charges.

An example of a practical constitution of the image sensing part 2 and memory part 3 of the above-mentioned CCD 1 will now be described with reference to FIG. 2. In this construction shown here, an example is shown whereby a well-known single-phase drive method was adopted as a method of driving the CCD.

Figure 2:
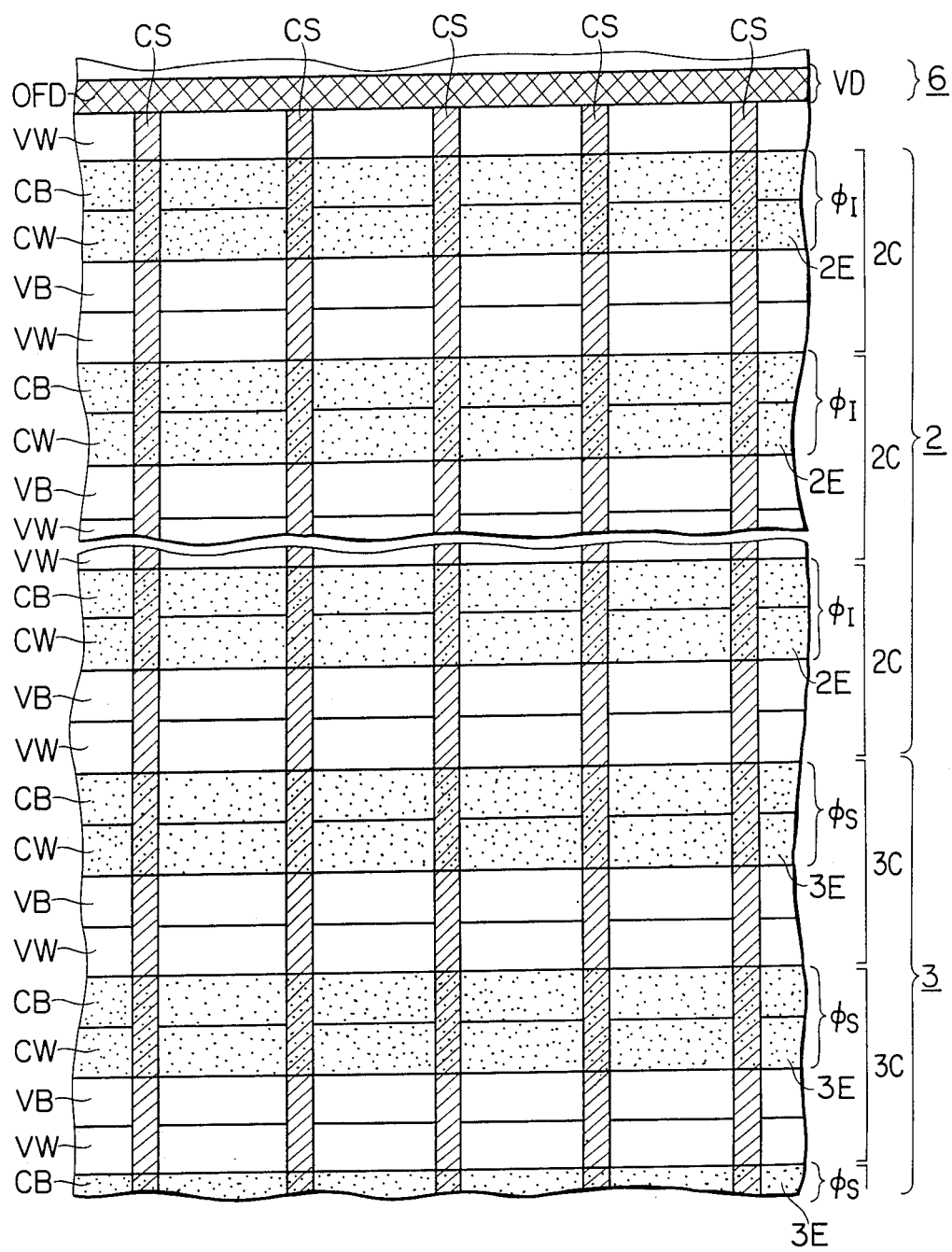
FIG. 2 is a diagram showing a practical structure of the main part of the CCD shown in FIG. 1.
Figure 3:
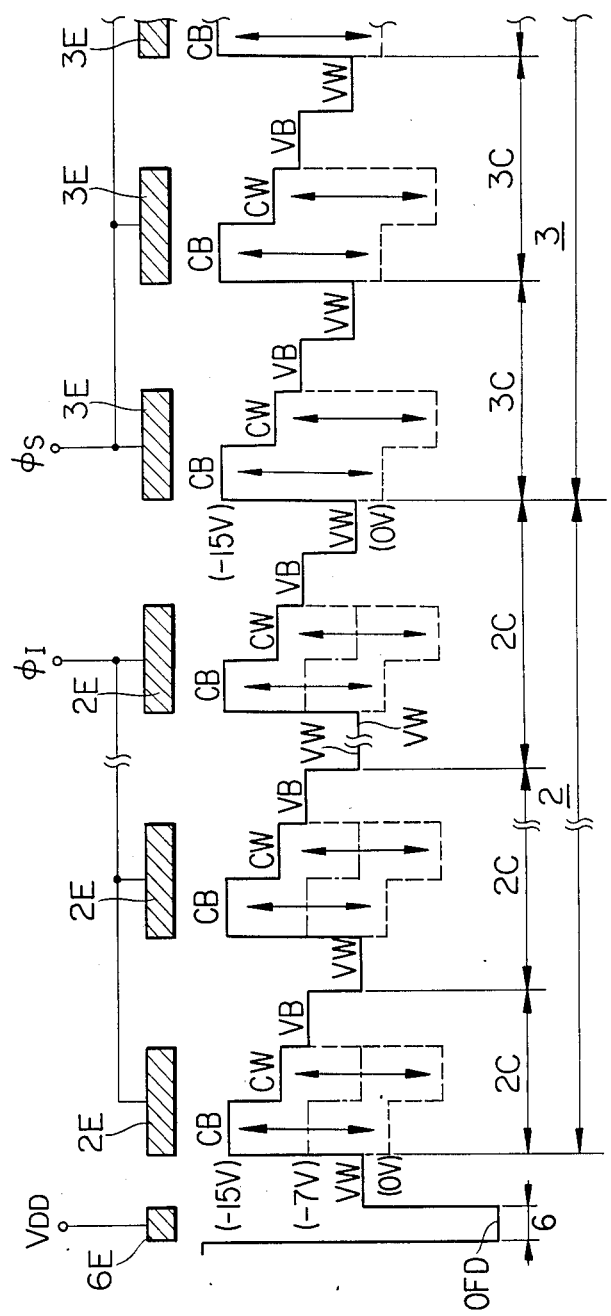
FIG. 3 is a diagrammatical view showing the potential states of the CCD structure shown in FIG. 2.

In FIG. 2, CS denotes a channel stopper for separating each column of an array of radiation sensitive cells in the image sensing part 2 from the next, and each column of an array of charge storage cells from the next column in the memory part 3; and CB, CW, VB and VW are clocked barrier, clocked well, virtual barrier, and virtual well each having predetermined potentials P(CB), P(CW), P(VB), and P(VW). The respective potentials P(VB) and P(VW) of the virtual barrier VB and virtual well VW are fixed so as to meet the relation of P(VB)>P(VW) as shown in FIG. 3 by means of ion implantation or the like. On the other hand, the respective potentials P(CB) and P(CW) of the clocked barrier CB and clocked well CW are set so as to always meet the relation of P(CB)>P(CW) as shown in FIG. 3 by means of ion implantation or the like. At the same time, these barriers and wells are constituted in such a manner that when a low voltage (e.g., $-15$ volts) is applied to them through their respective electrodes (E), the potentials become P(CW)>P(VB) as shown by the solid lines in FIG. 3, while when a high voltage (e.g., 0 volt) is applied to them, the potentials become P(CB)<P(VW) as indicated by the broken lines in FIG. 3. Each sign of inequality represents the relation in height between the potentials (i.e., high>low). A unit cell in the vertical direction, namely, a radiation sensitive cell 2C and a charge storage cell 3C in both image sensing part 2 and memory part 3 are constituted by a combination of the virtual well VW, virtual barrier VB, clocked well CW, and clocked barrier CB. Reference numerals 2E and 3E are common electrodes (polysilicon) for each clocked well CW and clocked barrier CB of the image sensing part 2 and memory part 3, respectively. Control signals $\phi_I$ and $\phi_S$ are applied to these electrodes 2E and 3E, respectively. The above-mentioned overflow drain 6 is disposed through the virtual well VW on the uppermost portion (clocked barrier CB) of the image sensing part 2 as shown in FIG. 2 and a bias voltage $V_{OD}$ is applied to it electrode 6E.

Returning to FIG. 1, a reference numeral 11 indicates a clock generator for generating reference clock signal; 12 is a drive circuit for generating the control signal $\phi_I$ to the image sensing part 2 of the CCD 1, control signal $\phi_S$ to the memory part 3 of the same, control signal $\phi_T$ to the horizontal shift register 4 of the same, and reference sync signals $\phi_V$ and $\phi_H$ for vertical (V) and horizontal (H) sync signals which are needed in an image pickup signal processor which will be described later, respectively, in response to the reference clock signal from the clock generator 11; 13 is an image pickup signal processor for outputting a video signal after receiving the image pickup signal output from the output amplifier 5 of the CCD 1 and the reference sync signals $\phi_V$ and $\phi_H$ from the drive circuit 12; 14 an analog gate circuit provided on the output side of the processor 13; and 15 a recorder for recording a signal representing a still picture of one field or one frame of a television in, for example, one or two concentric circular tracks on a rotary recording medium (rotary magnetic sheet) 17 by means of a recording head (magnetic head) 16, namely, this recorder 15 receives the output video signal of the processor 13 through the gate circuit 14 and converts it into a recording signal and then supplies the recording signal to the recording head 16, thereby recording. A reference numeral 18 is a recording start switch which is closed when starting the recording; 19 is a one-shot circuit (monostable multivibrator) for outputting one pulse signal in response to the turning-on of that switch 18; and 20 is a record controller which outputs e.g. a high signal (gate control signal $\phi_G$) to the gate circuit 14 to turn on the gate circuit 14 in the period of 1 V, i.e. of one field or in the period of 2 V, i.e. of one frame in response to the pulse signal from the one-shot circuit 19 and to the reference sync signal $\phi_V$ from the drive circuit 12 for the V sync signal, on the other hand the record controller 20 outputs, e.g. a high signal ($\phi_I$ level control signal $\phi_C$) for allowing the level of the control signal $\phi_I$ to be output from the drive circuit 12 to change from an ordinary low level ($-15$ volts) to a high level (0 volt) or to an intermediate level (e.g., $-7$ volts) in the period corresponding to the charge storing period in the image sensing part 2 of the CCD 1 in the above-mentioned recording period corresponding to 1 V or 2 V. A numeral 21 is a selecting switch to select the period when the gate circuit 14 is turned on by the record controller 20 (namely, to select the field (1 V) recording or the frame (2 V) recording). This switch 21 is connected to the gate controller 20 and this gate controller 20 selects the period of one field (1 V) for example when the switch 21 is ON (on the side of 1 V), while it selects the period of one frame (2 V) when the switch is OFF (on the side of 2 V), respectively. A numeral 22 is a motor to rotate the recording medium 17, which is controlled to rotate the recording medium 17 at 3600 rpm in the case where one field of the television signal in accordance with the NTSC system is recorded while forming one annular track on the recording medium 17.

In the above-described constitution, when a power supply circuit (not shown) is first turned on, a power voltage is supplied to the circuit system of FIG. 1, so that the circuits numbered at 11, 12 and 13 are made operative, thereby allowing the CCD 1 to be driven and permitting the processor 13 to start processing of the output image pickup signal. At the same time, the motor 22 starts the rotation of the recording medium 17 in the direction indicated by an arrow in FIG. 1.

The drive operation of the CCD 1 will now be described in detail. The control signal $\phi_I$ to the electrode 2E is maintained at a low level (e.g., $-15$ volts) as shown in (I) of FIG. 4 to allow the image sensing part 2 to generate and store the charges in accordance with the luminance distribution of the optical image formed on the image sensing part 2, so that the potential in each radiation sensitive cell 2C of the image sensing part 2 assumes the state shown by the solid line in FIG. 3, thereby causing the charges generated by each radiation sensitive cell 2C to be accumulated mainly in the respective virtual well VW. During this period, by applying the clock pulse (e.g., the horizontal sync pulse of the TV) which alternately repeats the low level (e.g., $-15$ V) and the high level (e.g., 0 V) as shown in (I) of FIG. 4 as the control signal $\phi_S$ to the electrode 3E of the memory part 3 to read out the charges stored therein, the potential in each charge storage cell 3C alternately assumes the state indicated by the solid line and the state represented by the broken line in FIG. 3. The stored charges in each storage cell are transferred in accordance with the order of the virtual well VW→ clocked barrier CB→ clocked well CW, then clocked well CW→ virtual barrier VB→ virtual well VW to the horizontal shift register 4 on a line-by-line basis. These charge signals are read out one line at a time from the register 4 by applying the control signal $\phi_T$ (horizontal transfer clock pulse (not shown)) for the horizontal charge transfer to the register 4. (That is to say, (I) of FIG. 4 denotes the storage and readout mode.)

Figure 4:
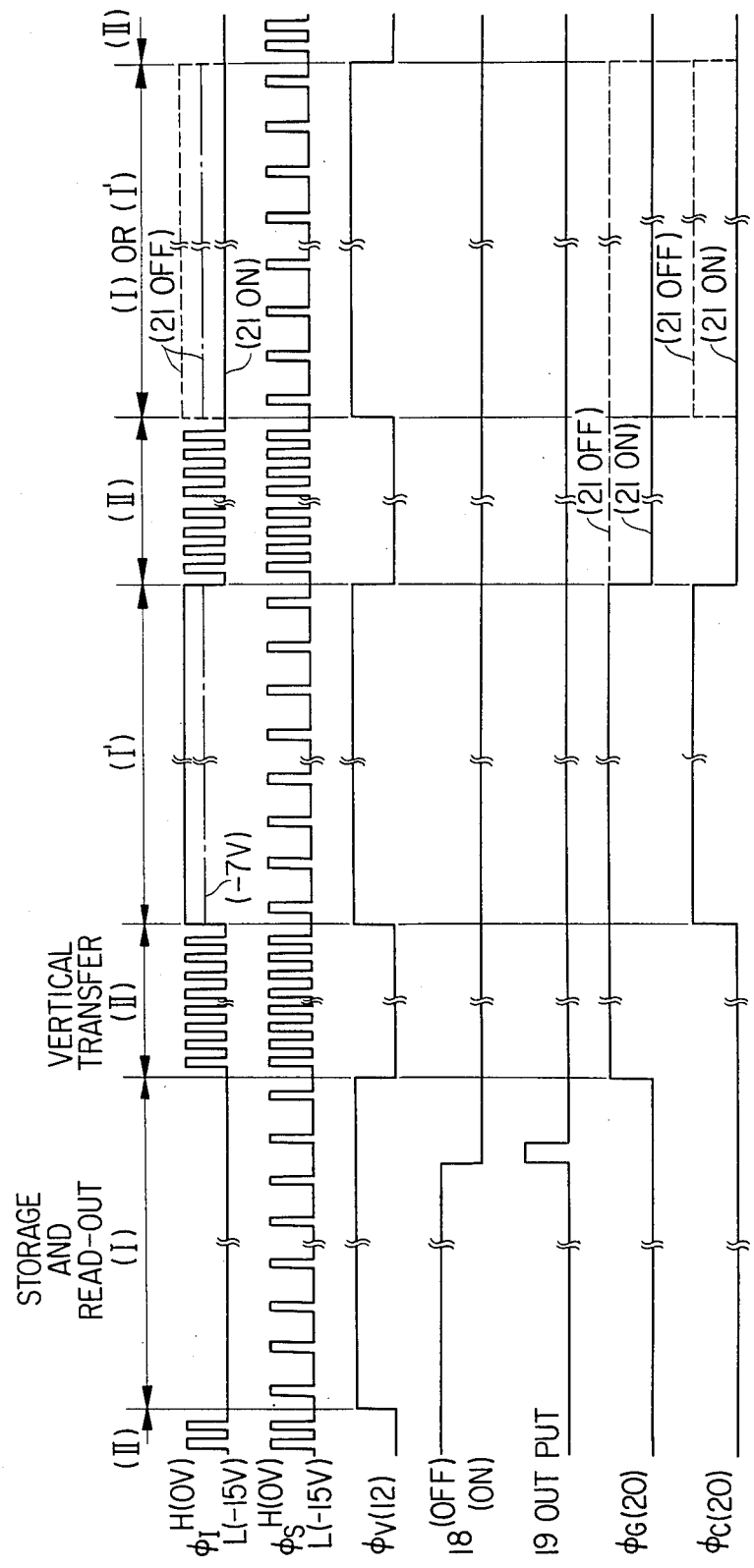
FIG. 4 is a timing chart showing an example of each control signal to be applied to the circuit and CCD of the main part in the circuit system shown in FIG. 1.

In this way, in order to vertically transfer the charges generated and stored by the image sensing part 2 to the memory part 3, as the control signal $\phi_I$ to the electrode 2E of the image sensing part 2 and as the control signal $\phi_S$ to the memory part 3, the clock pulses which alternately repeat the low and high levels as shown in (II) of FIG. 4 (actually, the phase of the pulse $\phi_S$ is slightly advanced with respect to that of the pulse $\phi_I$) are almost synchronously applied, respectively. Thus, the potential in each radiation sensitive cell 2C of the image sensing part 2 and the potential in each charge storage cell 3C of the memory part 3 alternately repeat the states indicated by the solid line and broken line in FIG. 3. Therefore, the charges are sequentially vertically transferred from the image sensing part 2 to the memory part 3 in accordance with the order of virtual well VW→ clocked barrier CB→ clocked well CW, then clocked well CW→ virtual barrier VB→ virtual well·VW. (Namely, (II) of FIG. 4 denotes the vertical transfer mode.)

After this vertical charge transfer mode has been finished, the operation again advances to the storage and readout mode and the signals as shown in (I) of FIG. 4 are applied as the control signals $\phi_I$ and $\phi_S$, respectively.

In the manner as described above, the CCD 1 is driven, the output image pickup signal is processed by the processor 13, the video signal is output from this processor 13, and the recording start switch 18 is turned on as shown in FIG. 4 while the recording medium 17 is being rotated; thus, the one-shot circuit 19 outputs one pulse signal in response to the turning-on of the switch 18 as shown in FIG. 4. Due to this, in response to the reference sync signal $\phi_V$ (shown in FIG. 4) from the drive circuit 12 immediately after the pulse signal from the one-shot circuit 19, the record controller 20 allows the gate control signal $\phi_G$ to be high in the period corresponding to 1 V when the switch 21 is ON or in the period corresponding to 2 V when it is OFF as shown in FIG. 4, and at the same time the controller 20 permits the $\phi_I$ level control signal $\phi_C$ to be high in the period corresponding to the charge storing period in the image sensing part 2 of the CCD 1. The gate circuit 14 is turned on in response to the gate control signal $\phi_G$ at the high level, so that the output video signal from the processor 13 is supplied to the recorder 15 in the above-mentioned period corresponding to 1 V or 2 V. After the video signal has been converted to the recording signal by the recorder 15, it is recorded by the head 16 as still picture information of one field or one frame in one or two concentric circular tracks on the recording medium 17 which is being rotated. On the other hand, at this time, the drive circuit 12 immediately maintains the control signal $\phi_I$ to the image sensing part 2 of the CCD 1 at the high level (0 V) or at an intermediate level ($-7$ V) as shown by (I') of FIG. 4 in response to the $\phi_I$ level control signal $\phi_C$ at the high level. Consequently, the potential in each radiation sensitive cell 2C of the image sensing part 2 of the CCD 1 assumes the state indicated by the broken line (in the case of $\phi_S$ at high level) or that indicated by the alternate long and short dash line (in the case of $\phi_S$ at intermediate level) in FIG. 3. Even if overflow charges are generated in at least part of the image sensing part 2 in such potential states as mentioned above, they will hardly flow from the image sensing part 2 to the memory part 3 since with respect to the overflow charges at this time, the potential of the clocked barrier CB of each storage cell 3C in the first row of the memory part 3 is higher than the potential of any portion of each radiation sensitive cell 2C of the image sensing part 2 in most of the time period. Instead the above-mentioned overflow charges substantially all flow into the overflow drain 6 disposed on the uppermost portion of the image sensing part 2 and are cleared there. As described above, since the potential in the image sensing part 2 is maintained in the state represented by the broken line or alternate long and short dash line of FIG. 3 during the recording, even if overflow charges were generated in the image sensing part 2, it is possible to prevent the inconvenience that the charges stored in the memory part 3, i.e., the inherent charges which will be converted into the signal to be recorded, are disturbed due to the inflow of the overflow charges into the memory part 3.

Furthermore, in the frame recording mode, in the case where the charges for the second field are stored during the recording of the first field by permitting the control signal $\phi_I$ to be at the high level (in the potential state indicated by the broken line in FIG. 3, these charges for the second field are mainly accumulated in the clocked well CW of each radiation sensitive cell 2C). On the other hand, in the case where those charges are stored by allowing the control signal $\phi_I$ to be at an intermediate level (in the potential state indicated by the alternate long and short dash line in FIG. 3), the charges for the second field are mainly accumulated in the clocked well CW and virtual well VW of each radiation sensitive cell 2C. In the latter case, upon vertical charge transfer ((II) of FIG. 4), the charges of the clocked well CW are first transferred to the virtual well VW and both charges are added in each radiation sensitive cell 2C to combine as the charges for one horizontal scan signal, and thereafter these charges are vertically transferred from the image sensing part 2 to the memory part 3 in the same manner as described previously.

Figure 5:
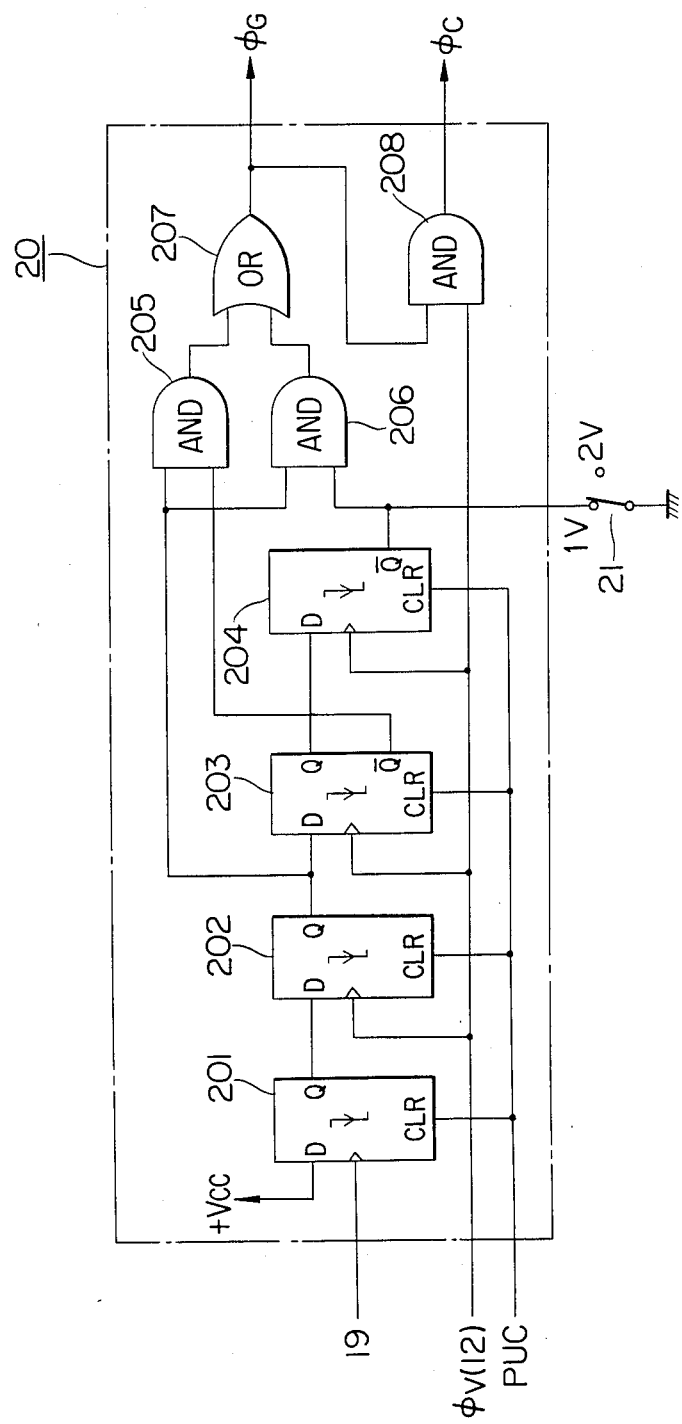
FIG. 5 is a block circuit diagram showing a practical example of the record controller shown in FIG. 1.

A practical example of the previously-described record controller 20 has, for example, a construction as shown in FIG. 5. That is to say, in the diagram, reference numerals 201-204 denote D flip flops of the trailing synchronous type, respectively. All of them are cleared by the power-up clear pulse PUC to be developed when turning on the power supply. The Q output of the flip flop 201 changes from low to high (201Q output of FIG. 6) in response to the trailing edge of the output pulse (19 output of FIG. 6) from the one-shot circuit 19 since the D input of the flip flop 201 is set into high level. The Q output of the flip flop 201 is sent to the D input of the flip flop 202. The Q output of the flip flop 202 changes from low to high (202Q output of FIG. 6) in response to the trailing edge of the first vertical sync signal $\phi_V$ ($\phi_V$ of FIG. 6) after the pulse has been output from the one-shot circuit 19. The Q output of the flip flop 202 is sent to the D input of the next flip flop 203, so that the $\overline{Q}$ output of the flip flop 203 changes from high to low (203$\overline{Q}$ output of FIG. 6) in response to the second vertical sync signal $\phi_V$. The Q output of the flip flop 203 is further sent to the D input of the next flip flop 204, so that the $\overline{Q}$ output of the flip flop 204 changes from high to low in response to the third vertical sync signal $\phi_V$. The $\overline{Q}$ output terminal of this flip flop 204 is connected to the terminal on the side of "1 V" of the selecting switch 21, so that such a change in the $\overline{Q}$ output as mentioned above is obtained when the switch 21 is OFF (i.e., it is connected to the terminal on the side of "2 V"), but its $\overline{Q}$ output is maintained to be low (204$\overline{Q}$ output of FIG. 6) when the switch 21 is ON (connected to the terminal on the side of "1 V"). An AND gate 205 receives both Q output of the flip flop 202 and $\overline{Q}$ output of the flip flop 203; therefore, its output is high in the period of 1 V as shown by 205 output of FIG. 6. An AND gate 206 receives the Q output of the flip flop 202 and the $\overline{Q}$ output of the flip flop 204, so that its output is high in the period of 2 V only when the selecting switch 21 is OFF as shown by 206 output of FIG. 6. An OR gate 207 receives the outputs of these AND gates 205 and 206, so that its output is as shown by 207 output of FIG. 6 and the output of this OR gate 207 becomes the gate control signal $\phi_G$ here.

Figure 6:
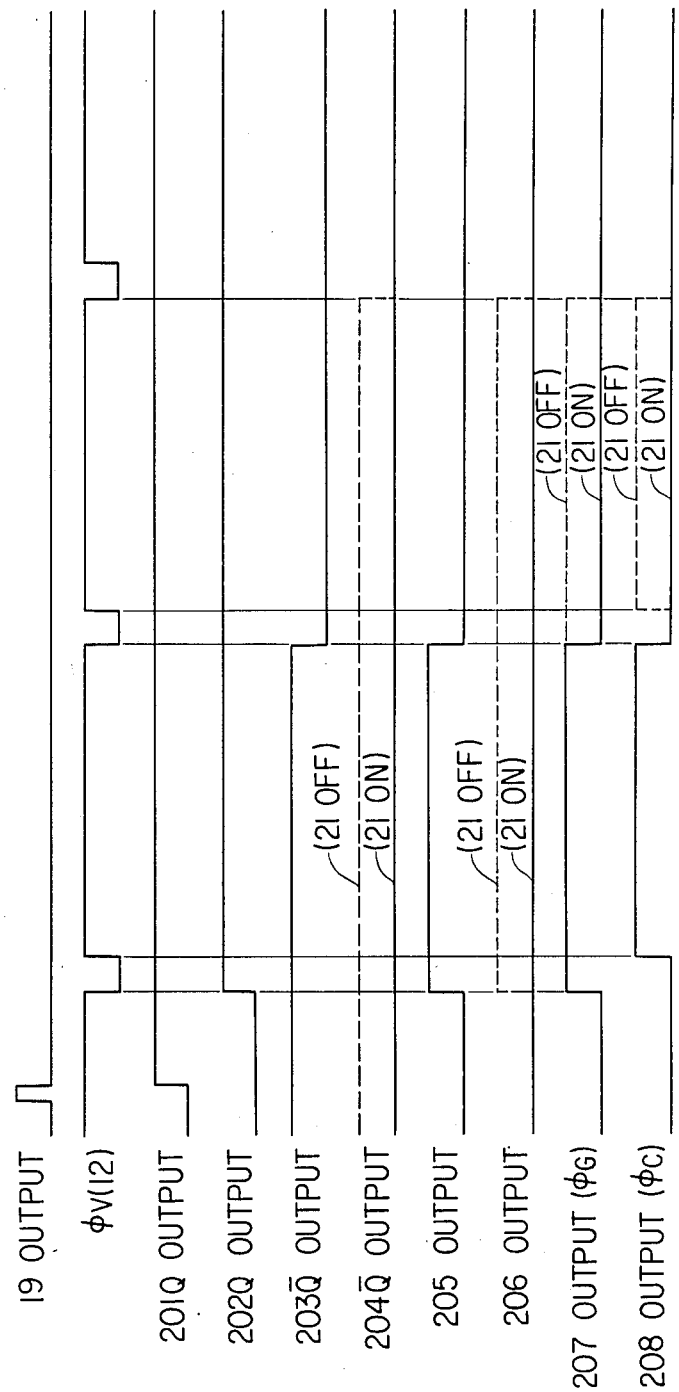
FIG. 6 is a timing chart showing the input and output of each circuit block in the circuit shown in FIG. 5.

On the other hand, an AND gate 208 receives the output of the OR gate 207 and the vertical sync signal $\phi_V$, so that its output is as shown by 208 output of FIG. 6, and the output of this AND gate 208 becomes the $\phi_I$ level control signal $\phi_C$ here.

Figure 7:
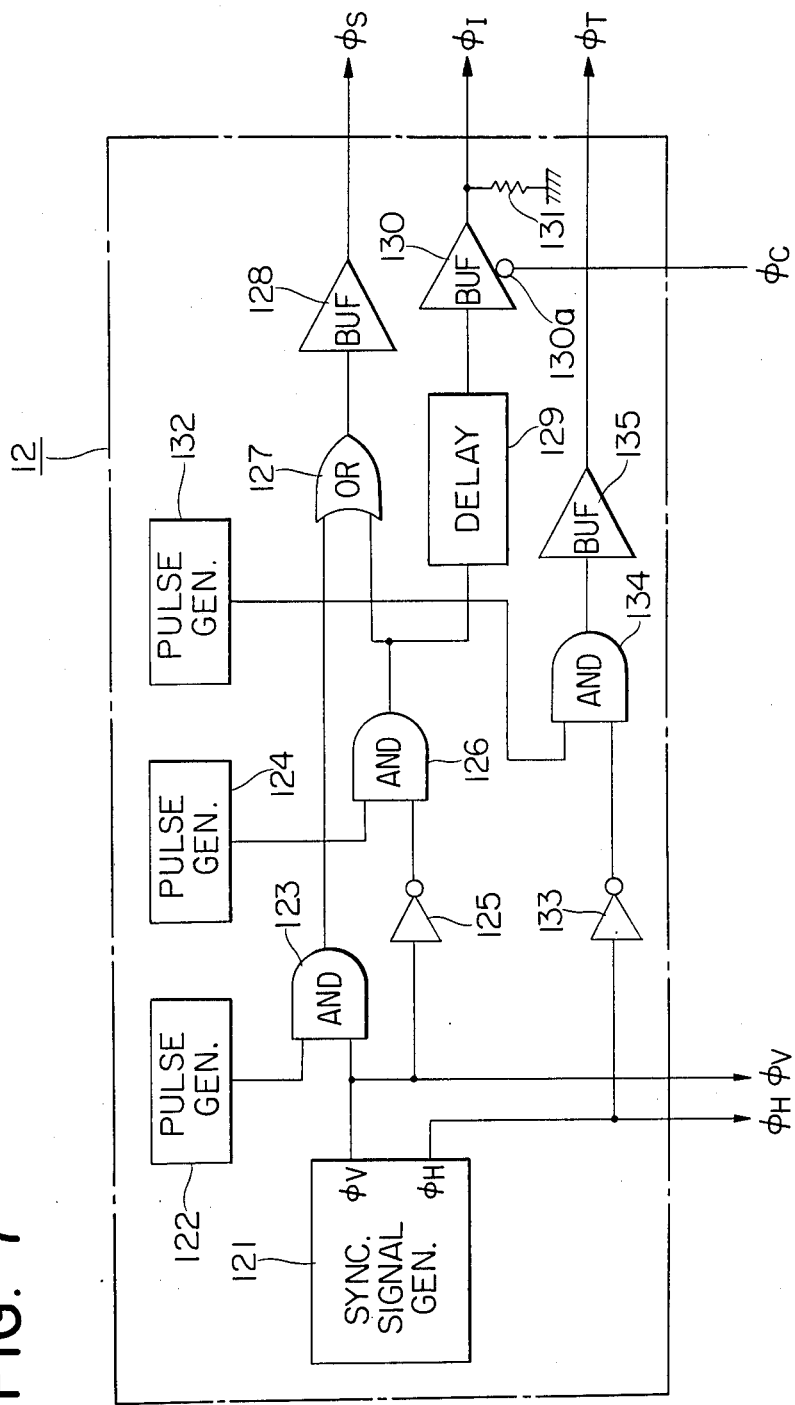
FIG. 7 is a block circuit diagram showing a practical example of the drive circuit shown in FIG. 1.

A practical example of the previously-mentioned drive circuit 12 has a constitution such as shown in, for example, FIG. 7. Namely, in the diagram, a reference numeral 121 denotes a sync signal generator for generating the vertical and horizontal sync signals $\phi_V$ and $\phi_H$ for the television in response to the reference clock signal from the clock generator 11; 122 is a timing pulse generator (hereinafter, referred to as a $\phi_1$ generator) for generating the timing pulse $\phi_1$ which is a reference signal for allowing the charges to be transferred from the memory part 3 of the CCD 1 to the horizontal register 4; 123 an AND gate which receives the vertical sync signal $\phi_V$ from the sync signal generator 121 and the timing pulse $\phi_1$ from the $\phi_1$ generator 122, thereby allowing the timing pulse $\phi_1$ to pass only in the period when the vertical sync signal $\phi_V$ is high; 124 a timing pulse generator (hereinafter, referred to as a $\phi_2$ generator) for generating the timing pulse $\phi_2$ which is a reference signal for allowing the charges to be transferred vertically from the image sensing part 2 of the CCD 1 to the memory part 3; 125 an inverter for inverting the vertical sync signal $\phi_V$ from the sync signal generator 121; 126 an AND gate which receives the output of the inverter 125 and the timing pulse $\phi_2$ from the $\phi_2$ generator 124, thereby permitting the timing pulse $\phi_2$ to pass only in the period when the vertical sync signal $\phi_V$ is low; and 127 is an OR gate which receives the outputs of the AND gates 123 and 126 and its output becomes the original signal of the control signal $\phi_S$ to the memory part 3 of the CCD 1. The pulse to be output from the OR gate 127 is a pulse such as to change between, e.g., 0 volt and +5 volts; therefore, it is converted into a pulse which changes between −15 V and 0 V by a voltage shift buffer 128, so that the output of this voltage shift buffer 128 becomes the control signal $\phi_S$ to the memory part 3.

A reference numeral 129 is a delay circuit provided to cause the output of the AND gate 126 to be delayed by an extremely short time if necessary, and its output becomes the original signal of the control signal $\phi_I$ to the image sensing part 2 of the CCD 1. Since the signal to be output from the delay circuit 129 is a signal such as to change between, e.g., 0 V and +5 V similarly to the case of the OR gate 127, it is converted into a signal which changes between −15 V and 0 V by a voltalge shift buffer 130. The voltage shift buffer 130 mentioned here is a tristate voltage shift buffer, to which the $\phi_I$ level control signal $\phi_C$ is applied at its control terminal 130a. The voltage shift buffer 130 becomes high impedance when this control signal $\phi_C$ is high. On the other hand, the output terminal of this voltage shift buffer 130 is connected through a resistor 131 to the circuit ground at substantially 0 volt (or to the power supply of −7 V), so that the output of this buffer 130 becomes 0 V (or −7 V) when the control signal $\phi_C$ is high. The output of this voltage shift buffer 130 here becomes the control signal to the image sensing part 2.

A reference numeral 132 denotes a timing pulse generator (hereinbelow, referred to as a $\phi_3$ generator) for generating the timing pulse $\phi_3$ which is a reference signal for allowing the charges to be transferred horizontally from the horizontal register 4 of the CCD 1; 133 an inverter for inverting the horizontal sync signal $\phi_H$ from the sync signal generator 121; 134 an AND gate which receives the output of the inverter 133 and the timing pulse $\phi_3$ from the $\phi_3$ generator 132, thereby allowing the timing pulse $\phi_3$ to pass only in the period when the horizontal sync signal $\phi_H$ is low, and its output becomes the original signal of the control signal $\phi_T$ to the horizontal register 4 of the CCD 1. Since the output to be output from the AND gate 134 is a pulse such as to change between e.g., 0 V and +5 V similarly to the case of the OR gate 127, it is converted into a pulse which changes between −15 V and 0 V by a voltage shift buffer 135, so that the output of this voltage shift buffer 135 here becomes the control signal $\phi_T$ to the horizontal register 4.

As a consequence, with such a constitution of the above-described embodiment, it is possible to prevent the undesirable situation such that the overflow charges generated by the image sensing part 2 flow into the memory part 3 during the recording of a video signal by controlling the image sensing part 2 in the manner such that the maximum height of the barrier(s) CB and/or VB in the image sensing part 2 of the CCD 1 is lower than the maximum height of the barrier CB in the memory part 3, and at the same time, for example, the blooming preventing portions for every predetermined number of columns of an array of radiation sensitive cells 2C in the image sensing part 2 such as in a conventional device completely fall into disuse, so that the horizontal dimension can be reduced or the number of radiation sensitive cells 2C in the horizontal direction can instead be greatly increased, thereby enabling the horizontal resolution to be remarkably improved.

Furthermore, in the above embodiment, the control signal $\phi_I$ is maintained at −15 V ((I) of FIG. 4) upon ordinary generation and storage of charged in the image sensing part 2, i.e. in the non-recording mode, while this is maintained at 0 V or −7 V ((I') of FIG. 4) for the recording; however, as a modification, even if the control signal $\phi_I$ is maintained at −7 V ordinarily, i.e. when the charges are generated and stored in the non-recording mode and it is maintained at 0 V when recording, a similar effect can be obtained. It will be apparent that such a modification can be easily derived by adjustment of the voltage applied to the tri-state voltage shift buffer of FIG. 7.

In addition, although the frame transfer type CCD has been adopted as an image pickup device in the above-described embodiment, it is also possible to utilize other well-known interline type CCD or line-address type CCD, etc. as the image pickup device in the recording apparatus of the present invention.

An embodiment of a solid-state image pickup device according to the present invention will now be described with reference to FIGS. 8-11.

Figure 8:
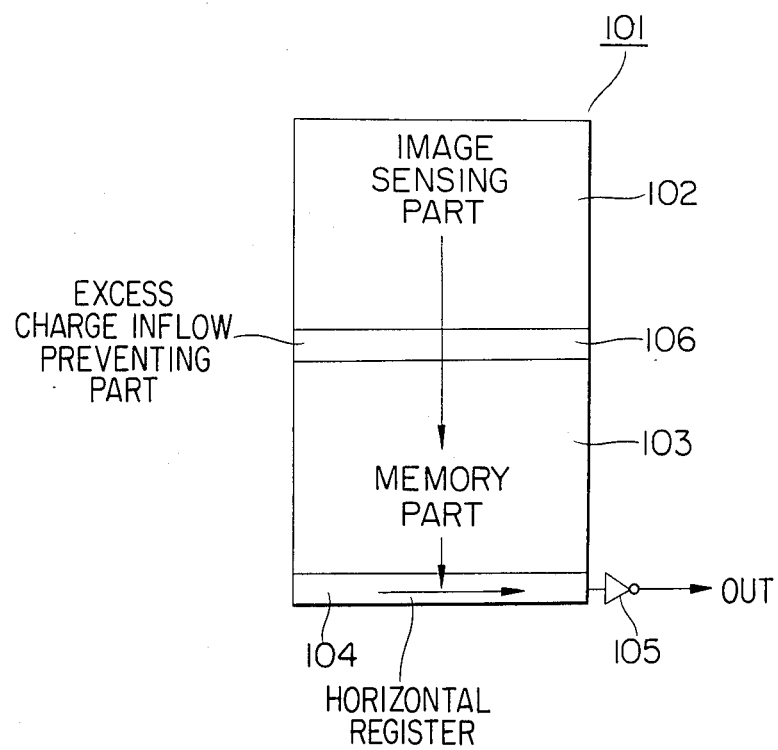
FIG. 8 is a diagrammatical view showing a schematic constitution of a frame transfer type CCD as one embodiment of a frame transfer type solid-state image pickup device according to the present invention.

Referring first to FIG. 8, a reference numeral 101 indicates a frame transfer type CCD to which the present invention was applied; 102 denotes an image sensing part having an array of a plurality of radiation sensitive cells (picture elements) arranged in rows and columns for generating respective charges in response to incident light; 103 is a memory part similarly having an array of a plurality of charge storage cells arranged in rows and columns for taking the charges and for termporalily storing them to read out the charges generated by the image sensing part 102, and as will be described later, each column of each array of the radiation sensitive cells and charge storage cells is separated from the next by a channel stopper. A reference numeral 104 denotes a horizontal shift register for reading out charges by taking the charges stored in the memory part 103 on a line-by-line basis and horizontally transferring them; 105 is an output part, provided at the final stage of the horizontal register 104, for converting the charges to be sequentially transferred from the register 4 into a voltage and for outputting it; and 106 is an excess charge inflow preventing part, disposed near the boundary between the image sensing part 102 and the memory part 103, for preventing excess charges generated by the image sensing part 102 from flowing into the memory part 103 according to the present invention.

An example of a practical constitution of the image sensing part 102, excess charge inflow preventing part 106, and memory part 103 will now be described with reference to FIG. 9. In the construction shown here, an example is shown whereby a well-known single-phase drive method was adopted as a method of driving the CCD.

Figure 9:
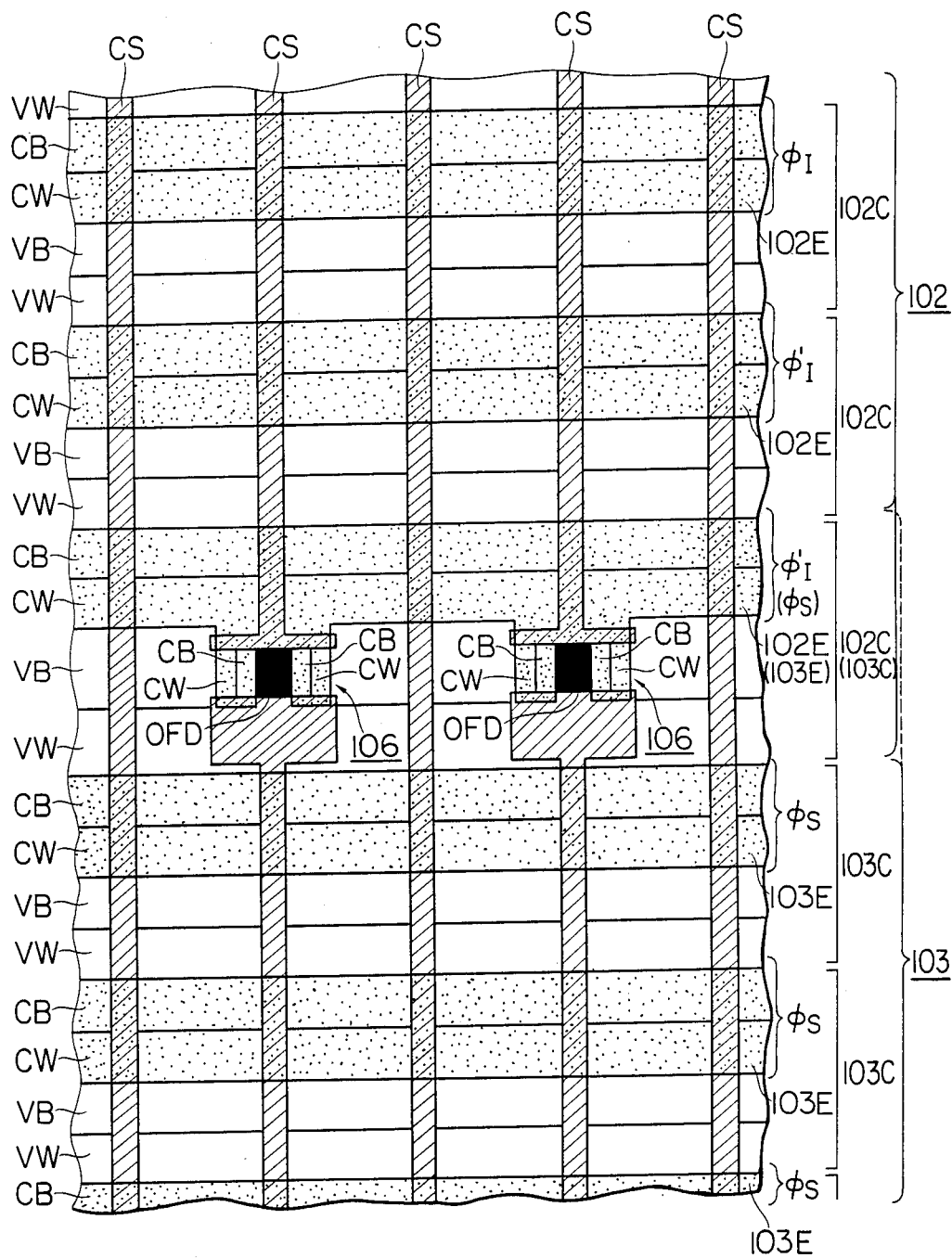
FIG. 9 is a diagram showing a practical construction of the main part of the CCD shown in FIG. 8.
Figure 10:
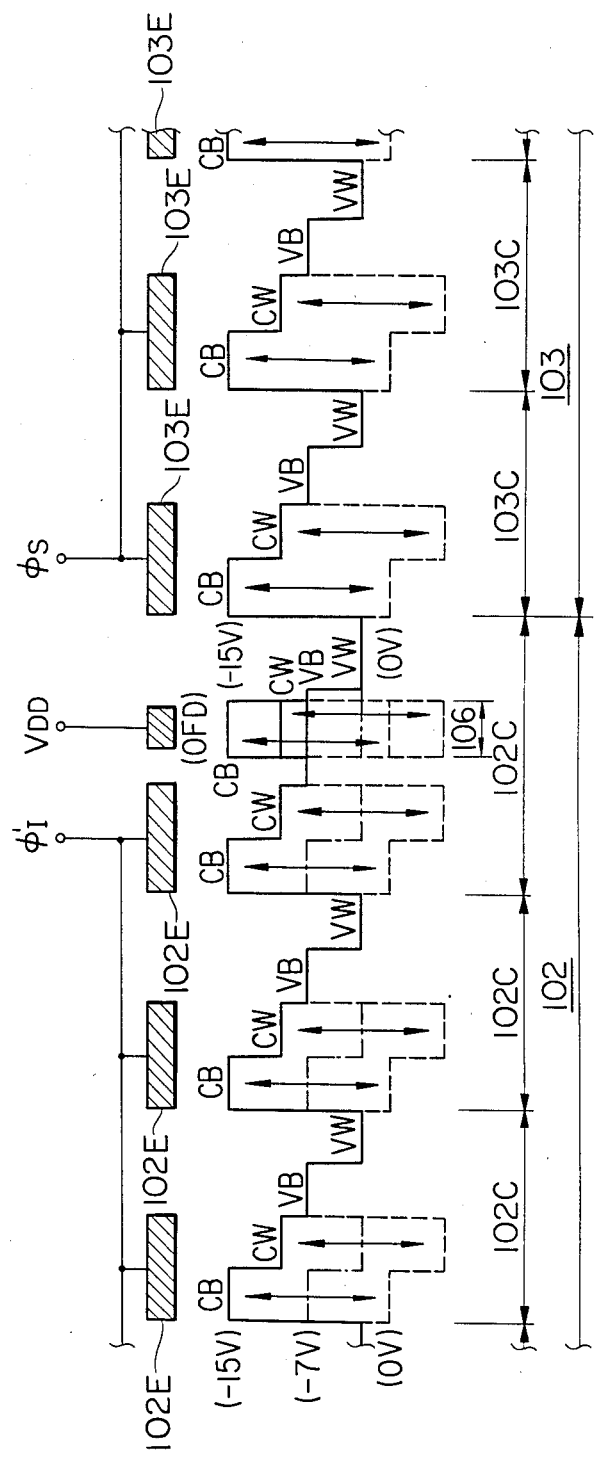
FIG. 10 is a diagrammatical view showing the potential states of the CCD structure shown in FIG. 9.

In FIG. 9, CS denotes a channel stopper for separating each column of an array of radiation sensitive cells in the image sensing part 102 and each column of an array of charge storage cells in the memory part 103; and CB, CW, VB, and VW are clocked barrier, clocked well, virtual barrier, and virtual well each having predetermined potentials P(CB), P(CW), P(VB), and P(VW). The respective potentials P(VB) and P(VW) of the virtual barrier VB and virtual well VW are fixed so as to meet the relation of P(VB)>P(VW) as shown in FIG. 10 by means of ion implantation or the like. On the other hand, the respective potentials P(CB) and P(CW) of the clocked barrier CB and clocked well CW are set so as to simply meet the relation of P(CB)>P(CW) as shown in FIG. 10. At the same time, these barriers and wells are constituted in such a manner that when a low voltage (e.g., −15 volts) is applied to them through their respective electrodes (E), the potentials become P(CW)>P(VB) as shown by the solid lines in FIG. 10, while when a high voltage (e.g. 0 volt) is applied to them, the potentials become P(CB)<P(VW) as indicated by the broken lines in FIG. 10. Each sign of inequality represents the relation in height between the potentials (i.e., high>low). A unit cell is the vertical direction, namely, a radiation sensitive cell 102C and a charge storage cell 103C in both image sensing part 102 and memory part 103 are constituted by a combination of the virtual well VW, virtual barrier VB, clock well CW, and clocked barrier CB.

Reference numerals 102E and 103E are common electrodes (polysilicon) for each clocked well CW and clocked barrier CB of the image sensing part 102 and memory part 103, respectively.

The above-mentioned excess charge inflow preventing part 106, in this example, is disposed in each boundary portion in the final row of the image sensing part 102 at the rates such that radiation sensitive cells 102C to the preventing part 106 are 2:1. This preventing part 106 is constituted by an overflow drain OFD provided in the portion where the channel stopper was removed, clocked barriers CBs disposed on both sides thereof, and clocked wells CWs disposed further on both sides the clocked barriers CBs. Each clocked well CW is disposed adjacent to the virtual barrier VB of each radiation sensitive cell 102C. The electrode 102E for the clocked barrier CB and clocked well CW of each radiation sensitive cell 102C is elongated and formed on the clocked barrier CB and clocked well CW.

Although in this example, the preventing part 106 is disposed in each boundary portion in the final one row of the image sensing part 102 at the rates such that the radiation sensitive cells 102C to the preventing part 106 are 2:1, for example as shown by the reference numerals to which the symbols ( ) were added in the diagram, it may be also possible to dispose the preventing part 106 in each boundary portion in the first one row of the memory part 103 at the rates such that the charge storage cells 103C to the preventing part 106 are 2:1.

The control signal $\phi_I'$ is supplied to the electrode 102E of the image sensing part 102, while the control signal $\phi_S$ is supplied to the electrode 103E of the memory part 103. The overflow drains OFDs of the preventing parts 106 are commonly connected by means of An Al evaporated layer or the like, and a bias voltage $V_{OD}$ is applied thereto.

Figure 11:
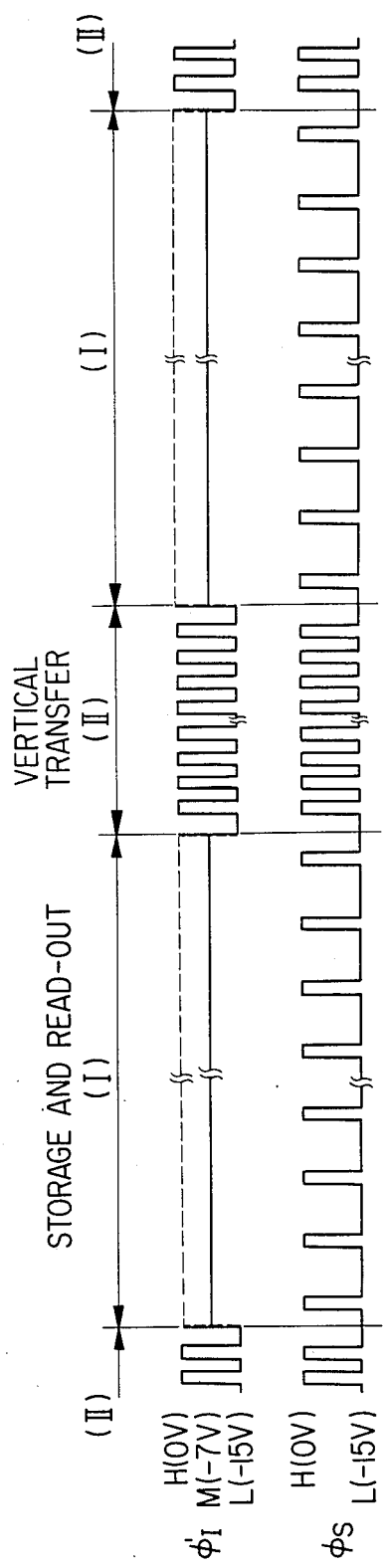
FIG. 11 is a timing chart showing an example of a control signal to be applied to the CCD structure shown in FIG. 9.

In the operation of the CCD 101 having such a constitution as described above, in the case where the charges are first generated and stored in the image pickup part 102 in accordance with the distribution of an incident light, the control signal $\phi_I'$ to the electrode 102E is maintained to for example an intermediate level (e.g., −7 volts) as shown in (I) of FIG. 11. Thus, the potential in each radiation sensitive cell 102C of the image pickup part 102 assumes the state shown by the alternate long and short dash line in FIG. 10. Therefore, the charges generated by each radiation sensitive cell 102C are mainly accumulated in the clock well CW and virtual well VW, respectively. On the other hand, during this period, by applying the clock pulse (e.g., horizontal sync pulse of the television) which alternately repeats the low level (e.g., −15V) and the high level (e.g., 0V) as shown in (I) of FIG. 11 as the control signal $\phi_S$ to the electrode 103E of the memory part 103 to read out the stored charges, the potential in each charge storage cell 103C alternately repeats the states indicated by the solid line and broken line in FIG. 10. Thus, the charges stored in each charge storage cell are transferred to the horizontal register 104 on a line-by-line basis in accordance with the order of virtual well VW→clocked barrier CB clocked well CW, then clocked well CW→virtual barrier VB→virtual well VW, and then they are read out through the register 104 one line at a time. (Namely, (I) of FIG. 11 denotes the storage and readout mode.)

The charges are stored in the image sensing part 102 in the state in that the control signal $\phi_I'$ is maintained to the high level (e.g., 0V) as shown by the broken line in (I) of FIG. 11. That is to say, in this case, the potential in each radiation sensitive cell 102C assumes the state shown by the broken line in FIG. 10, so that the charges generated by each radiation sensitive cell 102C are mainly accumulated in the clocked well CW, respectively.

Next, in case of vertically transferring the charges generated and stored in the image sensing part 102 to the memory part 103 in the manner as described above, as the control signal $\phi_I'$ to the electrode 102E of the image sensing part 102 and as the control signal $\phi_S$ to the electrode 103E of the memory part 103, the clock pulses each of which alternately repeats between the low level (e.g., −15V) and the high level (e.g., 0V) are almost synchronously applied, respectively, as shown in (II) of FIG. 11. Thus, the potential in each radiation sensitive cell 102C of the image sensing part 102 and the potential in each charge storage cell 103C of the memory part 103 alternately repeat the state indicated by the solid line and the state represented by the broken line in FIG. 10. Therefore at this time, in each radiation sensitive cell 102C, the charges stored in the clocked well CW are first transferred to the virtual well VW, where they are added to the charges which have been accumulated in the virtual well VW. Thereafter they are sequentially vertically transferred from the image sensing part 102 to the memory part 103 in accordance with the order of virtual well VW→clocked barrier CB→clocked well CW, then clocked well CW→virtual barrier VB→virtual well VW. (Namely, (II) of FIG. 11 represents the vertical transfer mode.)

Now, assuming that an overflow of charges has occurred in at least a portion of the image sensing part 102, i.e., in at least one radiation sensitive cell 102C, for example, while the charges stored in the memory part 103 are being read out (i.e., while the charges are being stored in the image sensing part 102), since the channel stopper CS is disposed between the columns of each radiation sensitive cell 102C, the overflow charges in this case are diffused vertically (longitudinally) along these columns and finally they reach the radiation sensitive cell 102C of the last one row of the image sensing part 102. The overflow charges which reach the radiation sensitive cell 102C of the last row are collected to the virtual well VW. However, at this time, if the amount of these overflow charges exceeds the accumulation capacity (capacity of the virtual well VW) of the radiation sensitive cell 102C of the last row, the overflow charges which exceed the accumulation capacity of the radiation sensitive cell 102C will not flow into the memory part 3 since the potential of the clocked barrier CB of the excess charge inflow preventing part 106 is lower than the potential of the clocked barrier CB of each charge storage cell 103C of the first one row of the memory part 103 in most of the time period. Instead, the overflow charges flow into the overflow drain OFD through the clocked well CW and clocked barrier CB of the preventing part 106 and then they are cleared.

In this way, there has been described the case where the control signal $\phi_I'$ to the electrode 102E of the image sensing part 102 is maintained at an intermediate level ($-7V$) for allowing the potential in each radiation sensitive cell 102C to become such a state as indicated by the alternate long and short dash line in FIG. 10, thereby accumulating the charges. On the other hand, as shown by the broken line in (I) of FIG. 11, even in the case where the control signal $\phi_I'$ is maintained at the high level (0V) for allowing the potential in each radiation sensitive cell 102C to become such a state as indicated by the broken line in FIG. 10, thereby to accumulate the charges, the potential of the clocked barrier CB of the excess charge inflow preventing part 106 is similarly lower than the potential of the clocked barrier CB of the memory part 103 in most of the time period during the accumulation period. Therefore, most of the overflow charges which flowed into the virtual well VW of the radiation sensitive cell 102C of the last row of the image sensing part 102 immediately flow into the overflow drain OFD through the clocked well CW and clocked barrier CB of the preventing part 106 and then they are cleared.

As described above, even in the cases mentioned above, the overflow charges generated by the image sensing part 102 are absorbed by the excess charge inflow preventing part 106 disposed in the last row and do not flow into the memory part 103, so that this prevents the possibility such that the charges stored in the memory part 103 which are at present being read out are disturbed due to the overflow charges in the image sensing part 102 as mentioned above.

As a result, according to the constitution of the present embodiment, it is possible to prevent the undesirable situation that the excess charges generated by the image sensing part 102 flow into the memory part 103, and at the same time all of the blooming preventing parts disposed for every predetermined number of columns of the array of radiation sensitive cells 102C in the image sensing part 102 such as in a conventional device fall into disuse, thereby enabling the horizontal dimension to be reduced or enabling the number of horizontal radiation sensitive cells 102C to be remarkably reduced. Therefore, it is possible to greatly improve the horizontal resolution.

Furthermore, in the description of the above embodiments, the excess charge inflow preventing part 106 has been disposed in the last row of the image sensing part 102 or in the first row of the memory part 103, but it may of course be disposed in other rows. However, it is preferable to dispose the preventing part 106 as near to the boundary between the image sensing part 102 and the memory part 103 as possible for the purpose of preventing the disturbance of the stored charges due to the inflow of the overflow charges generated by the image sensing part 102 into the memory part 103.

In addition, although a CCD has been described as an example in the embodiments, the present invention can be also applied to other devices such as BBD, CPD, etc.

In addition, as a drive circuit for the CCD 101, the drive circuit 12 shown in FIG. 7 can be used by merely slightly changing a part thereof. In other words, in order to obtain the control signal $\phi_2'$ to the image sensing part 102 of this CCD 101 as shwon in FIG. 11, it is enough to change part of the connection in the manner such that the output of the inverter 125 in place of the control signal $\phi_C$ is applied to the control terminal 130a of the tri-state voltage shift buffer 130 in FIG. 7. As the control signal $\phi_S$ to the memory part 103 and as the control signal $\phi_T$ to be applied to the horizontal register 104, although its description was omitted, it is possible to use the outputs to be obtained in the constitution of FIG. 7, namely, the outputs themselves of the voltage shift buffers 128 and 135.

The above-mentioned CCD 101 may be of course used in place of the CCD 1 of FIG. 1.

According to the still picture recording apparatus of the present invention of which one embodiment has been described with respect to FIGS. 1-7, it is possible to completely eliminate the possibility that when recording a still picture, the excess charges generated by the image sensing part of the image pickup device flow into the memory part and disturb the stored charges and this causes a recording picture image to be greatly disturbed. Even if excess charges are generated in the image sensing part of the image pickup device, a good recording picture image can be always secured. Therefore, the present invention is extremely useful as a still picture recording apparatus.

Particularly, the recording apparatus of the present invention is effective against the generation of excess charges which exceed the performance of the blooming preventing means which will be ordinarily disposed for the image sensing part; in addition, it is extremely useful to realize the high resolution since the use of such blooming preventing means can be curtailed or can be eliminated altogether.

Moreover, according to the frame transfer type solid-state image pickup device of the present invention of which one embodiment has been described with respect to FIGS. 8-11, since all of the blooming preventing parts for every predetermined number of columns of the array of radiation sensitive cells in the image sensing part become unnecessary, the horizontal dimension can be reduced or the number of horizontal radiation sensitive cells can be remarkably increased, thereby enabling the horizontal resolution to be greatly improved; in addition, it is also possible to preferably prevent the situation such that the excess charges generated by the image sensing part flow into the memory part and disturb the former signal charges which have been stored therein, and other many advantages can be obtained.

From the foregoing, it will be apparent that the present invention is not limited only to the constructions of the above-described embodiments, but it is to be understood that the invention may be practiced in the light of the scope of the appended claims.

We claim:
1. A still picture recording apparatus comprising:
    (A) solid-state frame transfer type charge-coupled image pick-up means having:
    (A-1) an image pick-up portion for generating an image representing signal pattern in response to a received picture image;
    (A-2) a storage portion for temporarily storing said signal pattern generated by said pick-up portion;
    (A-3) a read-out portion for reading out the stored signal pattern from said storage portion to produce an electrical output corresponding to the signal pattern; and

(A-4) an overflow signal clear portion for clearing said image pick-up portion of overflow signals, said overflow signal clear portion being disposed along a first side of said image pick-up portion opposite to a second side thereof to which said storage portion is coupled;

(B) recording means for recording a video signal representing said picture image on the basis of the electrical output of said image pick-up means; and (C) control means for controlling said recording means and said image pick-up means, said control means enabling the recording means to record a video signal corresponding to a selected still picture image and causing said image pick-up means to prevent overflow signals from flowing into said storage portion from said image pick-up portion at least during the recording of the video signal by the recording means.

2. The apparatus according to claim 1, wherein said control means includes:

a recording control circuit for controlling said recording means, said control circuit enabling the recording means to record the video signal corresponding to the selected still picture image; and a drive circuit for driving said image pick-up means so that the pick-up means produces the electrical output, said drive circuit causing the pick-up means to prevent the overflow signals from flowing into said storage portion from said image pick-up portion at least during the recording of the video signal by said recording means.

3. The apparatus according to claim 2, wherein said recording control circuit includes means for producing a control signal for controlling said drive circuit so that the drive circuit causes said image pick-up means to prevent the overflow signals from flowing into said storage portion from said image pick-up portion only during the recording of the video signal by said recording means.

4. The apparatus according to claim 1, wherein said overflow signal clear portion is disposed near the boundary between said image pick-up portion and said storage portion.

5. The apparatus according to claim 4, wherein said overflow signal clear portion is disposed within said image pick-up portion.

6. A still picture recording apparatus comprising:

(A) charge-coupled image pick-up means having:

(A-1) an image pick-up portion for generating an image representing electrical charge pattern in response to a received picture image, said pick-up portion including a plurality of controllable potential barriers to form a plurality of charge storing cells;

(A-2) a storage portion for temporarily storing said charge pattern generated by said pick-up portion, said storage portion including a plurality of controllable potential barriers to form a plurality of charge storing cells; and (A-3) a read-out portion for reading out the stored charge pattern from said storage portion to produce an electrical output corresponding to the charge pattern;

(B) recording means for recording a video signal representing said picture image on the basis of the electrical output of said image pick-up means; and (C) control means for controlling said recording means and said image pick-up means, said control means enabling the recording means to record a video signal corresponding to a selected still picture image and controlling the pick-up means so that the maximum height of the barriers of said image pick-up portion to the electrical charges becomes lower than the maximum height of the barriers of the storage portion to the electrical charges at least during the recording of the video signal by said recording means.

7. The apparatus according to claim 6, wherein said control means includes:

a recording control circuit for controlling said recording means, said control circuit enabling the recording means to record the video signal corresponding to the selected still picture image; and a drive circuit for driving said image pick-up means so that the pick-up means produces the electrical output, said drive circuit controlling the pick-up means so that the maximum height of the barriers of said image pick-up portion to the electrical charges becomes lower than the maximum height of the barriers of the storage portion to the electrical charges at least during the recording of the video signal by said recording means.

8. The apparatus according to claim 7, wherein said recording control circuit includes means for producing a control signal for causing said drive circuit to control said image pick-up means so that the maximum height of the barriers of said image pick-up portion to the electrical charges becomes lower than the maximum height of the barriers of the storage portion to the electrical charges only during the recording of the video signal by said recording means.

9. The apparatus according to claim 6, wherein said image pick-up means is a frame transfer type charge-coupled image pick-up means.

10. The apparatus according to claim 9, wherein said image pick-up means further has an overflow charge clear portion for clearing said image pick-up portion of the overflow charges.

11. The apparatus according to claim 10, wherein said overflow charge clear portion is disposed along a first side of said image pick-up portion opposite to a second side thereof to which said storage portion is coupled.

12. 17. The apparatus according to claim 11, wherein said overflow charge clear portion is disposed near the boundary between said image pick-up portion and said storage portion.

13. The apparatus according to claim 12, wherein said overflow signal clear portion is disposed within said image pick-up portion.

14. A video recording apparatus comprising:

(A) charge-coupled image pick-up means having:

(A-1) an image pick-up portion for generating an image representing electrical charge pattern in response to a received picture image, said pick-up portion including a plurality of controllable potential barriers to form a plurality of charge storing cells;

(A-2) a storage portion for temporarily storing said charge pattern generated by said pick-up portion, said storage portion including a plurality of controllable potential barriers to form a plurality of charge storing cells; and (A-3) a read-out portion for reading out the stored charge pattern from said storage portion to produce an electrical output corresponding to the charge pattern;

(B) recording means for recording a video signal representing said picture image on the basis of the electrical output of said image pick-up means; and (C) control means for controlling said image pick-up means so that the maximum height of the barriers of said image pick-up portion to the electrical charges becomes lower than the maximum height of the barriers of the storage portion to the electrical charges at least during the recording of the video signal by said recording means.

15. A frame transfer type charge-coupled image pick-up device comprising:

(A) an array of a plurality of radiation sensitive cells arranged in rows and columns for generating an image representing an electrical charge pattern in response to a received image;

(B) an array of a plurality of charge storage cells arranged in rows and columns for temporarily storing the charge pattern generated by said radiation sensitive cell array;

(C) a read-out register for reading out the stored charge pattern from said storage cell array; and (D) means disposed near the boundary between said sensitive cell array and said storage cell array for preventing overflow charges from flowing into said storage cell array from said sensitive cell array, wherein said overflow preventing means includes overflow charge clear cells disposed within and arranged along the row of said sensitive cell array closest to said storage cell array, and wherein each of said overflow charge clear cells is disposed between two radiation sensitive cells in each of adjacent sensitive cells pairs.

16. An image pick-up apparatus comprising:

(A) image pick-up means for converting a received picture image into an electrical signal and accumulating the electrical signal in a potential well;

(B) storage means for storing the electrical signal accumulated by said image pick-up means wherein the stored signal constitutes an image signal;

(C) recording means for recording an output signal of said storage means;and (D) control means having a first operation mode in which a plurality of image signals are stored successively by driving said image pick-up means and said storage means with predetermined respective timings, and a second operation mode in which only an image signal for one picture image generated by said image pick-up means is stored through said storage means, wherein said control means changes a potential condition of said image pick-up means according to said first operation mode and said second operation mode, respectively, at least during the reading out of the image signal for recording from said storage means.

17. An apparatus according to claim 16, wherein said control means changes the height of potential barriers of said image pick-up means according to said first operation mode and said second operation mode, respectively, at least during the reading out of said image signal for recording from said storage means.

18. An apparatus according to claim 17, wherein the maximum height of potential barriers in said second operation mode is higher than that in said first operation mode.

19. An apparatus according to claim 16, wherein said control means causes said potential condition in said first operation mode to be a condition in which said storage means is more effectively prevented from blooming than in said potential condition of said second operation mode.

20. An apparatus according to claim 19, further comprising means disposed on the opposite side of said storage means for removing overflow charges.

21. An image pick-up apparatus comprising:

(A) image pick-up means for converting a received picture image into electrical output signal;

(B) recording means for recording the output signal of said image pick-up means;

(C) control means having a first operation mode in which a plurality of image signals are picked up by said image pick-up means, and a second operation mode in which an image signal for one picture is picked up by said image pick-up means, wherein said control means controls the image pick-up means to prevent blooming with the increased effectiveness in the second operation mode than in the first operation mode.

22. An apparatus according to claim 21, wherein said control means controls a potential condition in said image pick-up means.

23. An apparatus according to claim 22, wherein said control means provides different drive pulses to said image pick-up means according to the first operation mode and the second operation mode, respectively.

* * * * *